United States Patent

Suminaga et al.

[11] Patent Number: 5,757,709
[45] Date of Patent: May 26, 1998

[54] SEMICONDUCTOR MEMORY DEVICE

[75] Inventors: Yasuo Suminaga, Mie-ken, Japan; Lien Hsin Feng, Taipei, Taiwan

[73] Assignee: Sharp Kabushiki Kaisha, Osaka, Japan

[21] Appl. No.: 724,929

[22] Filed: Oct. 2, 1996

[30] Foreign Application Priority Data

Feb. 26, 1996 [JP] Japan .................. 8-038519

[51] Int. Cl.$^6$ .................................. G11C 11/419
[52] U.S. Cl. ................ 365/204; 365/203; 365/205; 365/230.06
[58] Field of Search ................ 305/189.01, 203, 305/230.01, 204, 205, 230.06

[56] References Cited

U.S. PATENT DOCUMENTS

| | | | |
|---|---|---|---|
| 5,351,215 | 9/1994 | Tanabe | 365/203 |
| 5,404,325 | 4/1995 | Shibata | 365/149 |
| 5,434,821 | 7/1995 | Watanabe et al. | 365/203 |
| 5,487,043 | 1/1996 | Furutani et al. | 365/203 |
| 5,539,279 | 7/1996 | Takeuchi et al. | 365/145 |
| 5,546,353 | 8/1996 | Philips et al. | 365/230.06 |
| 5,592,426 | 1/1997 | Fallice et al. | 365/203 |

FOREIGN PATENT DOCUMENTS

| | | |
|---|---|---|
| 3-142877 | 6/1991 | Japan . |
| 6-318683 | 11/1994 | Japan . |

*Primary Examiner*—Viet Q. Nguyen
*Attorney, Agent, or Firm*—Morrison & Foerster LLP

[57] ABSTRACT

A plurality of memory cells of a semiconductor memory device of the present invention are classified into a plurality of column groups. Drain electrodes of the memory cells belonging to the same column group are connected to the same first bit line. Source electrodes of the memory cells belonging to the same column group are connected to the same second bit line. A gate electrode of the memory cell belonging to one of the column groups is connected to the gate electrode of the memory cell belonging to another one of the column groups via a word line. An amplifier amplifies a potential of the selected second bit line.

11 Claims, 16 Drawing Sheets

SEMICONDUCTOR MEMORY DEVICE

BACKGROUND OF THE INVENTION

1. Field of the Invention

The present invention relates to a semiconductor memory device, more particularly, to a circuit for reading information stored in memory cells of a nonvolatile memory device.

2. Description of the Related Art

FIG. 14 shows a read only memory (ROM) as the nonvolatile memory device. The nonvolatile memory device of FIG. 14 includes a memory cell array having a plurality of memory cells (M1, M2, and M3, for example) composed of MOSFETs arranged in a matrix, a plurality of word lines WL1, ... WLn, ... WL32 each connected to gate electrodes of the memory cells, a plurality of bit lines (B21, B22, and B23, for example) each connected to source electrodes of the memory cells, and a plurality of bit lines (B11, B12, and B13, for example) each connected to drain electrodes of the memory cells. The word lines extend along rows of the matrix-shaped memory cell array, while the bit lines extend along columns of the matrixshaped memory cell array.

In the ROM with the above configuration, when information stored in the memory cell M2, for example, in the memory cell array is to be read, a selector (not shown) selects the bit lines B12 and B22 connected to the memory cell M2 based on an address signal. The selected bit line B12 is connected to a terminal of a load circuit LD, while the selected bit line B22 is connected to ground GND. The other terminal of the load circuit LD is connected to a terminal Vcc.

The selected bit lines B12 and B22 are precharged for a predetermined period of time to obtain an intermediate potential. The selector (not shown) selects the word line WLn connected to a gate electrode of the memory cell M2 and puts the word line WLn at a high level. As a result, a route 1 is established between the terminal Vcc and ground GND, allowing a bit line current to flow between the source and drain electrodes of the memory cell M2. The bit line current also flows through the load circuit LD which has the two terminals, causing a voltage drop between the two terminals of the load circuit LD. A sense amplifier (not shown) amplifies this voltage drop generated in the load circuit LD to detect the state of the memory cell M2.

More specifically, the bit line current varies depending on the state of the memory cell. As the bit line current varies, the amount of the voltage drop generated in the load circuit LD varies, thereby varying a bit line voltage Vbit obtained by subtracting the amount of voltage drop from a voltage Vhi of the terminal Vcc. The sense amplifier compares the bit line voltage Vbit with a reference voltage and determines the state of the memory cell M2.

Referring to FIG. 15, when the memory cell is in an ON state, the bit line voltage Vbit is equal to a voltage Von, while, when the memory cell is in an OFF state, the bit line voltage Vbit is equal to a voltage Voff.

As described above, in the conventional nonvolatile semiconductor memory device, the threshold of a memory cell selected by the bit lines and column selection lines is determined based on the amount of voltage drop generated in the load circuit when a bit line current flowing through the memory cell flows through the load circuit. This necessitates the bit line current to continue flowing through the memory cell and the load circuit during the period when information of the memory cell is read. This increases power consumption of the conventional nonvolatile semiconductor memory device.

A conventional NOR type nonvolatile semiconductor memory device also has a problem as follows.

Referring to FIG. 16, the operation where information stored in a memory cell M2 is read in response to a predetermined address signal will be described.

A selector (not shown) selects column selection lines BS1 and BS3 to put them at a high level based on the predetermined address signal, while retaining column selection lines BS2 and BS4 at a low level, thus allowing bit lines B2 and B3 to be selected. The selector also selects a word line WLn to put it at a high level, while retaining the other word lines WL1, WL32 in a low level. The memory cell M2 is thus selected. A route 1 is established between a terminal Vcc and ground GND, and a bit line current Ibit1 flows through a load circuit LD.

The state of the memory cell is determined based on the value obtained by subtracting a voltage generated by the flow of the bit line current Ibit1 through the load circuit LD from a voltage Vhi of the terminal Vcc.

The memory cell M2 is selected when the word line WLn is put at a high level as described above. At this time, memory cells M1 and M3 connected to the word line WLn are also selected. As a result, a bit line B1 adjacent to the selected bit line B2 is connected with the bit line B2 via the memory cell M1 which is in the ON state. Similarly, a bit line B4 adjacent to the selected bit line B3 is connected with the bit line B3 via the memory cell M3 which is in the ON state. Charges have been retained in the bit lines B1 and B4 in the previous read operations, so that currents flow through routes 2 and 3 via the memory cells M1 and M3, respectively. The bit line current Ibit1 varies due to these current flows through the routes 2 and 3, which makes it difficult to correctly read information stored in the memory cell M2.

Moreover, a bit line voltage Vbit varies even when the threshold of the memory cell M2 is fixed. The reason is that, since the thresholds of the memory cells M1 and M3 vary depending on the program written in the ROM, the amounts of currents flowing through the routes 2 and 3 vary, thereby varying the bit line current Ibit1 flowing through the load circuit.

Japanese Laid-Open Patent Publication No. 3-142877 discloses a virtual ground method where bit lines adjacent to selected bit lines are set at an intermediate voltage. According to this method, however, a leakage current increases and thus it is difficult to correctly read information stored in memory cells.

Japanese Laid-Open Patent Publication No. 6-318683 discloses a ROM where a threshold to be written in each memory cell is selected from three or more thresholds by adjusting the ion implantation amount. In such a ROM, however, the difference in the potential induced in the bit lines by the difference in the threshold voltage is small, thereby reducing the margin of the potential of the bit lines. This makes it difficult to correctly read information stored in the memory cell.

SUMMARY OF THE INVENTION

A semiconductor memory device of the present invention includes a plurality of memory cells arranged in a matrix; a plurality of word lines; a plurality of first bit lines; a plurality of second bit lines; a first column selector for selecting a first bit line from the plurality of first bit lines; a second column selector for selecting a second bit line from the plurality of second bit lines; and an amplifier, wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to one of the column groups is connected to the gate electrode of the memory cell belonging to another one of the column groups via one of the plurality of word lines, and the amplifier amplifies a potential of the selected second bit line.

In one embodiment of the invention, the semiconductor memory device further includes a first charger for charging the selected first bit line so that the selected first bit line obtains a first potential.

In one embodiment of the invention, the semiconductor memory device further includes a second charger for charging the selected second bit line so that the selected second bit line obtains a second potential.

In one embodiment of the invention, the semiconductor memory device further includes a first discharger for discharging the selected first bit line and a second discharger for discharging the selected second bit line.

In one embodiment of the invention, the semiconductor memory device further includes a first discharger for discharging the selected first bit line.

In one embodiment of the invention, the semiconductor memory device further includes a leakage circuit for allowing a current flowing through the selected second bit line to leak.

In one embodiment of the invention, the first and second dischargers discharge the selected first and second bit lines for a certain duration, and the first charger charges the selected first bit line after the certain duration has passed from the predetermined time so that the selected first bit line reaches the first potential.

Thus, the invention described herein makes possible the advantage of providing a semiconductor memory device capable of reading information in memory cells correctly by measuring the potential of a bit line which is less influenced by a leakage current or the like.

This and other advantages of the present invention will become apparent to those skilled in the art upon reading and understanding the following detailed description with reference to the accompanying figures.

DESCRIPTION OF THE PREFERRED EMBODIMENTS

Hereinbelow, the principle of the present invention will be described.

Figure 1:
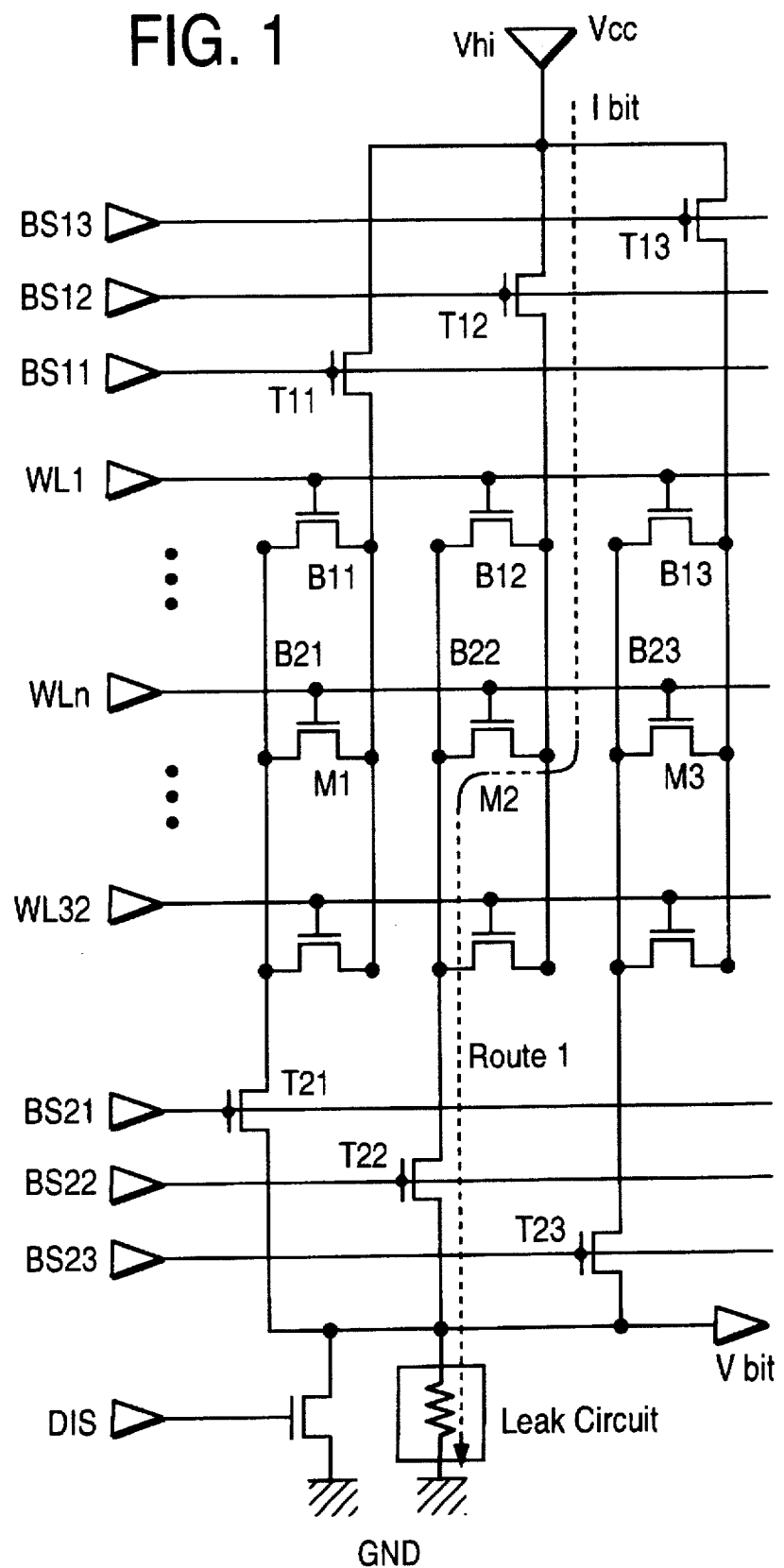
FIG. 1 shows a configuration of a portion of a semiconductor memory device according to the present invention.

Referring to FIG. 1 illustrating a configuration of a semiconductor memory device according to the present invention, a selector (not shown) selects a word line WLn to put it at a high level based on a predetermined address signal, while holding the other word lines WL1 and WL32 in a low level. The selector also selects column selection lines BS12 and BS22 to put them at the high level based on the predetermined address signal, while holding the other column selection lines BS11, BS13, BS21 and BS23 at the low level. Thus, a memory cell M2 and bit lines B12 and B22 are selected.

Before information in the memory cell M2 is read, a discharger discharges the selected bit lines B12 and B22 until each level of the bit lines B12 and B22 is lowered to a predetermined value based on discharge signal DIS. In this way, charges retained in the bit lines B12 and B22 from the previous read operations are discharged, returning the potentials of the bit lines B12 and B22 to their initial states. Thereafter, the bit line B12 is charged until the potential thereof reaches a voltage Vhi of a terminal Vcc.

Figure 2:
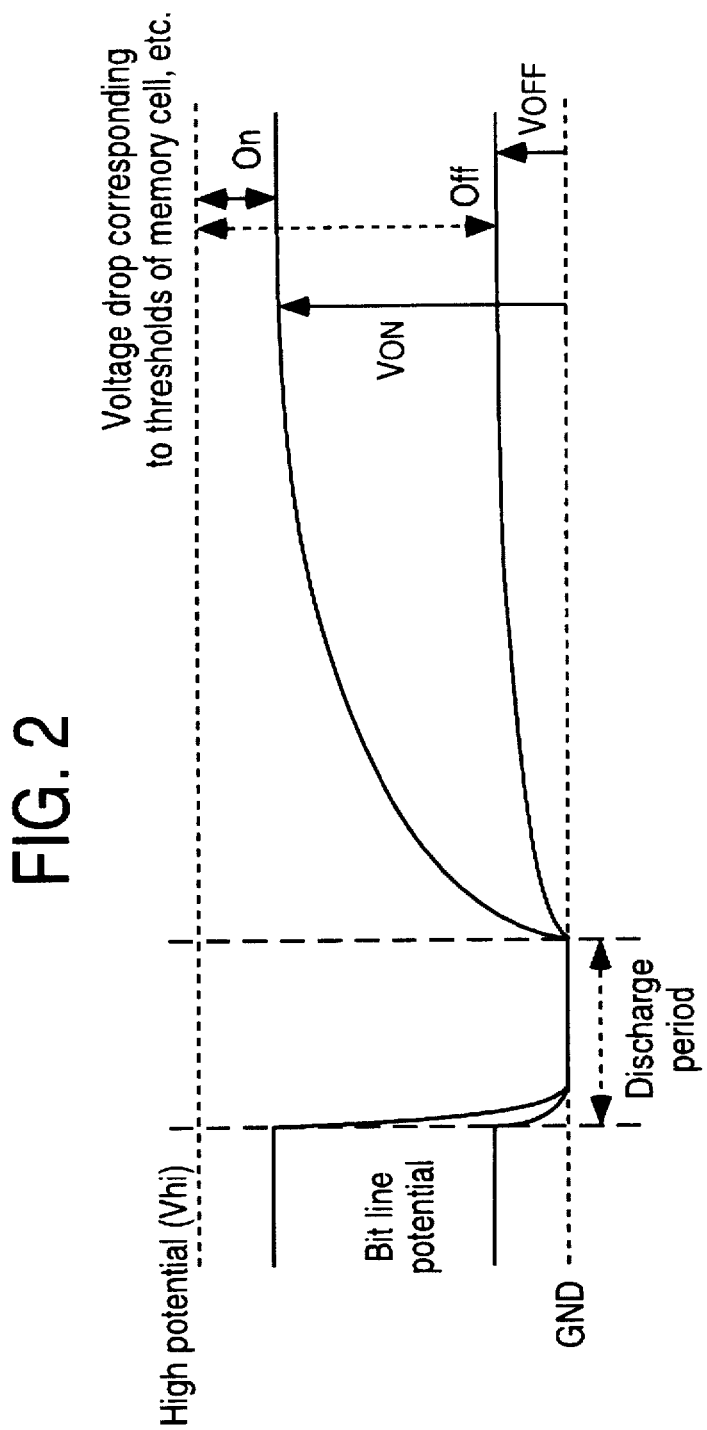
FIG. 2 shows a potential of a bit line of the semiconductor memory device of FIG. 1.

As shown in FIG. 2, a bit line voltage Vbit is a value obtained by subtracting the thresholds of a selective transistor T12, the memory cell M2, and a transistor T22 from the voltage Vhi. Thus, the current flowing through the bit line B22 only includes a small leakage current flowing via a leakage circuit as shown in FIG. 1. By comparing the bit line voltage Vbit which is generated by the leakage circuit with the reference voltage, information in the selected memory cell M2 can be read.

Figure 3:
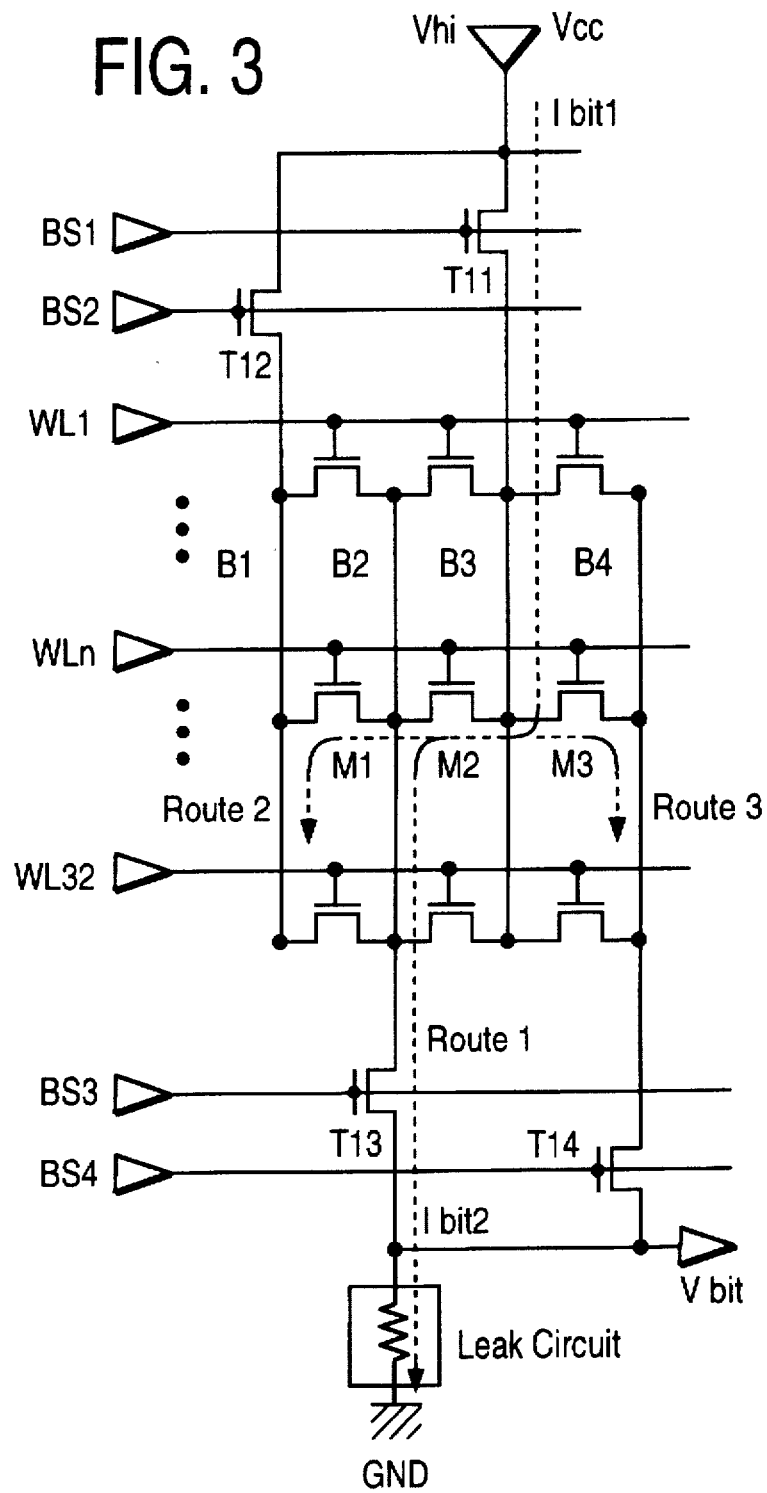
FIG. 3 shows a configuration of a portion of another semiconductor memory device according to the present invention.

FIG. 3 shows a configuration of an NOR type semiconductor memory device according to the present invention. In this type of semiconductor memory device, a plurality of memory cells are connected to a word line WLn. When the word line WLn is put at a high level, memory cells M1, M2, and M3, for example, connected to the word line WLn are turned to the ON state. As a result, a bit line current Ibit1 branches into three, for example, flowing through routes 1 to 3. Thus, the amount of the bit line current Ibit1 varies when leakage currents flowing through the routes 2 and 3 are generated. However, since the resistance between source and drain electrodes of the memory cell M2 is large compared with the OFF resistances of transistors T11, T12, T13, and T14, the variation in a bit line current Ibit2 flowing through a bit line B2 is small compared with the variation in the bit line current Ibit1 flowing through a bit line B3. Thus, information in the selected memory cell M2 can be read by comparing a bit line voltage Vbit generated by a leakage circuit connected to the bit line B2 via a column selector T13 with the reference voltage.

Figure 4:
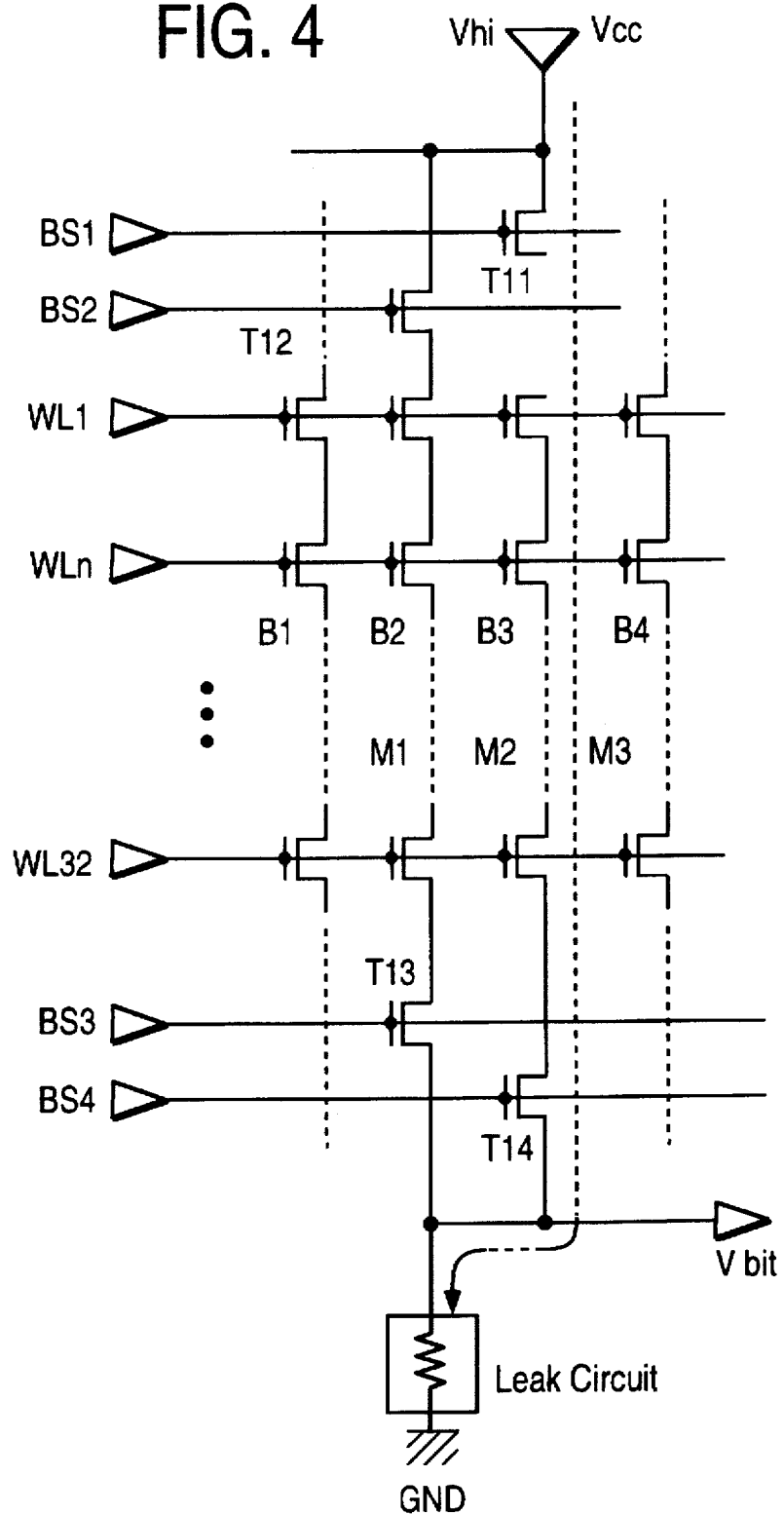
FIG. 4 shows a configuration of a portion of still another semiconductor memory device according to the present invention.

FIG. 4 shows a configuration of a NAND type semiconductor memory device according to the present invention. Referring to FIG. 4, one end of each column of memory cells is connected to a terminal Vcc via a first column selector having transistors T11 and T12, while the other end thereof is connected to ground GND via a leakage circuit and a second column selector having transistors T13 and T14. A bit line voltage Vbit generated by the leakage circuit located between the second column selector and ground GND is measured to read information stored in a memory cell. Thus, the operation of the NAND type semiconductor memory device of FIG. 4 is substantially the same as that of the semiconductor memory device of FIG. 1.

(EXAMPLE 1)

Figure 5:
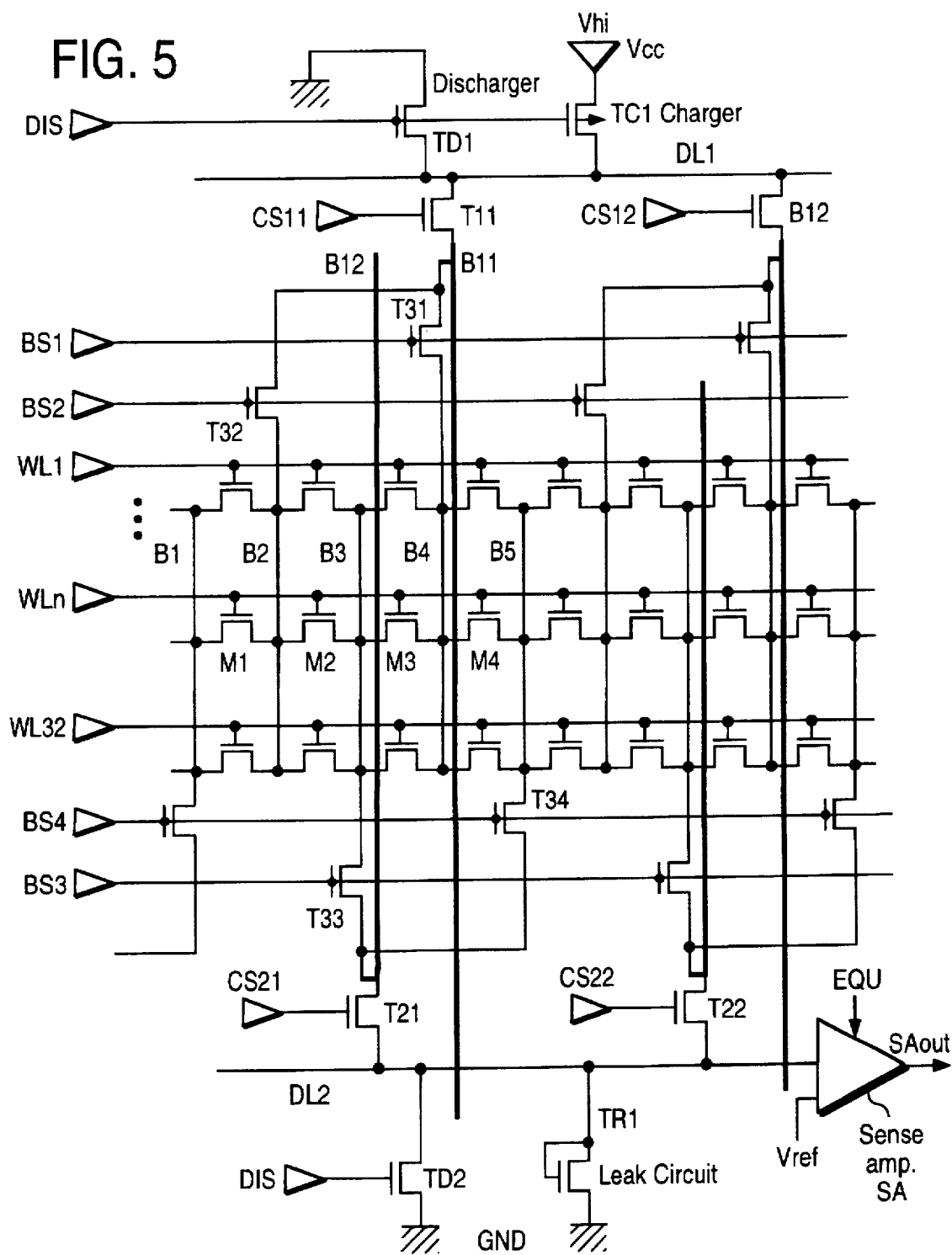
FIG. 5 shows a configuration of a portion of a semiconductor memory device of Example 1 according to the present invention.

A first example of the semiconductor memory device according to the present invention will be described with reference to FIGS. 5 to 8. FIG. 5 shows a configuration of the semiconductor memory device of Example 1. The semiconductor memory device of this example is characterized in that a sense amplifiercompares the potential of a second bit line connected to a source electrode of a selected memory cell with the reference potential.

The semiconductor memory device of FIG. 5 includes a plurality of memory cells (M1, M2, M3, and M4, for example) arranged in a matrix, a plurality of word lines WL1, . . . , WLn, . . . , WL32 connected to gate electrodes of the memory cells, a plurality of first bit lines (B11, for example) connected to source electrodes of the memory cells, a plurality of second bit lines (B12, for example) connected to drain electrodes of the memory cells, a first column selector (T11, T12, T31, and T32, for example) for selecting at least one of the plurality of first bit lines, a second column selector (T21, T22, T33, and T34, for example) for selecting at least one of the plurality of second bit lines, dischargers (TD1 and TD2, for example) for discharging the first and second bit lines selected by the column selectors, chargers (TC1, for example) for charging the first bit lines selected by the first column selectors, leakage circuits (TR1, for example), and sense amplifiers (SA, for example).

The plurality of memory cells M1, M2, M3 and M4 are classified into a plurality of column groups. Each of the memory cells has a drain electrode, a source electrode, and a gate electrode. The drain electrodes of the memory cells in the same column group are connected to the same first bit line. The source electrodes of the memory cells in the same column group are connected to the same second bit line. A gate electrode of a memory cell in a column group is connected to a gate electrode of a memory cell in another column group via a word line. Herein, the electrodes of each memory cell connected to the first bit line and the second bit line are referred to as the drain electrode and the source electrode, respectively. However, these electrodes may also be referred to in reverse. Each memory cell already includes information written therein. The writing of information in the memory cells can be conducted by implanting ions such as boron (B) ions in channel regions of the memory cells. The threshold voltage between the drain and source electrodes of the memory cell can be changed by changing the amount of ions implanted in the memory cell. The memory cell is classified as either a depression type or an enhanced type depending on the amount of implanted ions. In the case where the selected memory cell is of the depression type, the memory cell retains the OFF state when a voltage Vx is applied to the gate electrode, preventing a bit line current from flowing. In the case where the selected memory cell is of the enhanced type, the memory cell is turned to the ON state when the voltage Vx is applied to the gate electrode, allowing a bit line current to flow. In the case of an EEPROM, the threshold voltage between the drain and source electrodes of the memory cell can be changed by changing the amount of charge stored on a floating gate.

In the semiconductor memory device of FIG. 5, the first column selector T11, T12, T31, and T32 is connected to first column selection lines CS11, CS12, BS1, and BS2, respectively, the respective first bit lines B11, and a first data line DL1. The second column selector T21, T22, T33, and T34 is connected to second column selection lines CS21, CS22, BS3, and BS4, respectively, the respective second bit lines B12, and a second data line DL2.

A part of an address signal used for selecting a particular memory cell among the plurality of memory cells is input into the first column selector T11, T12, T31, and T32 via the first column selection lines CS11, CS12, BS1, and BS2, respectively. The address signal is an n-bit digital signal. The first column selector T11, T12, T31, and T32 electrically connects the first data line DL1 and the selected first bit line based on the part of the address signal.

Another part of the address signal is input into the second column selector T21, T22, T33, and T34 via the second column selection lines CS21, CS22, BS3, and BS4, respectively. The second column selector T21, T22, T33, and T34 electrically connects the second data line DL2 and the selected second bit line based on this other part of the address signal.

The dischargers TD1 and TD2 receive a discharge signal DIS which is either at a high level or a low level. When the discharge signal DIS is at the high level, the potentials of the first and second bit lines selected by the first and second column selectors T11, T12, T21, T22, T31, T32, T33, and T34 are set at the same potential as that of ground GND. This makes it possible to correctly read information in the selected memory cell.

Figure 6:
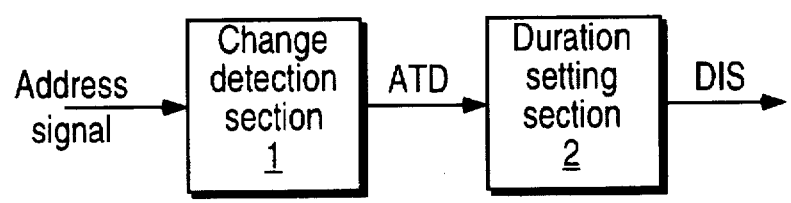
FIG. 6 shows a configuration of a circuit for generating a discharge signal.

Referring to FIG. 6, the discharge signal DIS is generated by a change detection section 1 and a duration setting section 2. The change detection section 1 receives an address signal, detects a change in the address signal, and outputs a signal ATD to the duration setting section 2 in response to the change in the address signal. The signal ATD is either at a high level or a low level. The duration setting section 2 receives the signal ATD from the change detection section 1, and outputs the high-level discharge signal DIS to the dischargers TD1 and TD2 and the charger TC1 for a duration predetermined based on the signal ATD.

The charger TC1 supplies a charge to the first bit line selected by the column selectors when the discharge signal DIS is at the low level. Thus, the potential of the second bit line connected to the source electrodes of the memory cells connected to the selected first bit line is lower than the potential of the selected first bit line.

The leakage circuit TR1 is connected between the second data line DL2 and ground GND. The leakage circuit TR1 causes a voltage drop by a current Ibit2 flowing through the second bit line selected by the second column selector T21, T22, T33, and T34. Incidentally, when the semiconductor memory device is provided with the leakage circuit as shown in FIG. 5, the discharger TD2 is not necessarily required.

The sense amplifier SA is connected to the second data line DL2 and a reference line for supplying a reference voltage Vref. The sense amplifier SA compares the potential of the second data line DL2 and the potential of the reference line, and outputs a signal SAout corresponding to the comparison result. The sense amplifier SA may be of a known differential amplification type. A voltage Vhi of a terminal Vcc may be a potential boosted from the source voltage.

The semiconductor memory device of FIG. 5 is a NOR type mask ROM where the source electrodes of memory cells in the same column group are connected to the same first bit line and the drain electrodes of the memory cells in the same column group are connected to the same second bit line. In nonvolatile semiconductor memory devices of other types such as those shown in FIGS. 1 and 4, information in a memory cell designated by the address signal can be read based on the potential difference generated by the leakage circuit connected to the second data line DL2 and ground GND.

Figure 7:
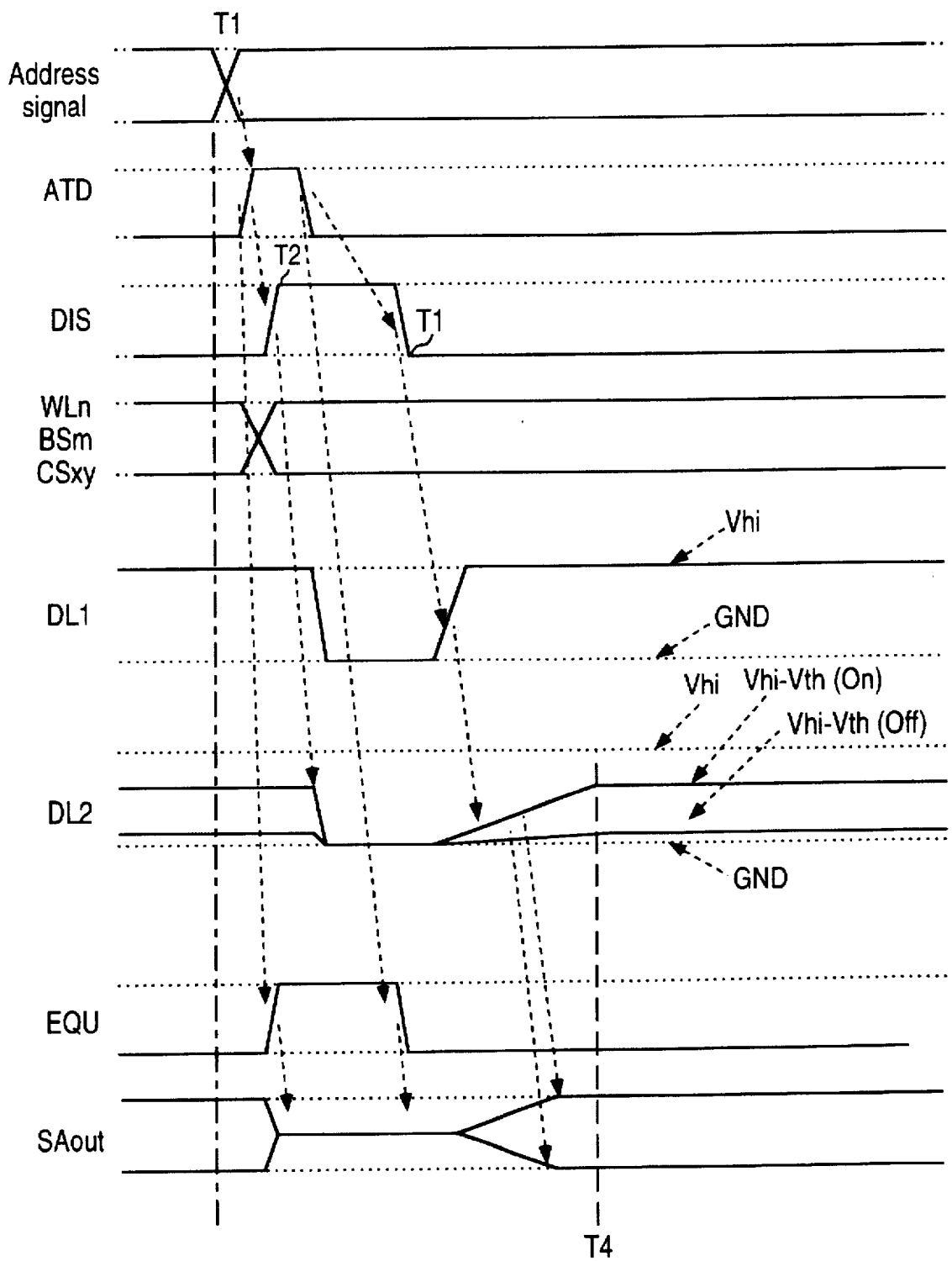
FIG. 7 is a timing chart of the semiconductor memory device of FIG. 5.

Hereinbelow, the read operation of the semiconductor memory device of FIG. 5 will be described with reference to the timing chart of FIG. 7. In the following description, it is assumed that information written in the memory cell M3 is to be read.

The change detection section 1 receives an address signal. When the address signal changes at time T1, the change detection section 1 outputs the signal ATD to the duration setting section 2. The duration setting section 2 outputs the discharge signal DIS to the dischargers TD1 and TD2 and the charger TC1 based on the signal ATD. The discharge signal DIS is a pulse signal, which is at the high level for a predetermined period from time T2 to time T3 after the change of the address signal.

Before the discharge signal DIS switches to the high level, the first and second bit lines retain the potentials obtained when information of the memory cells was read last time. The first bit line B11 and the second bit line B12 selected during the high-level period of the discharge signal DIS are initialized. More specifically, transistors of the dischargers TD1 and TD2 are turned to the ON state, allowing the potentials of the first and second bit lines to be equal to that of ground GND. At this time, the charger TC1 is in the OFF state.

At time T2, a part of the predetermined address signal is input into the first column selector having transistors T11, T12, T31, and T32. Based on this part of the predetermined address signal, the transistors T11 and T31 of the first column selector are turned to the ON state, while transistors T12 and T32 of the first column selector are turned to the OFF state. Thus, the first bit line B11 is selected. Another part of the predetermined address signal is input into the second column selector having transistors T21, T22, T33, and T34. Based on this other part of the predetermined address signal, the transistors T21 and T33 of the second column selector are turned to the ON state, while the transistors T22 and T34 of the column selector are turned to the OFF state. Thus, the second bit line B12 is selected. Based on yet another part of the predetermined address signal, the word line WLn is selected. As a result, the memory cell M3 is selected based on the predetermined address signal.

When the discharge signal DIS switches to the low level at time T3, the dischargers TD1 and TD2 are turned to the OFF state, while the charger TC1 is turned to the ON state. Thus, the potential of the data line DL1 becomes equal to the voltage Vhi which is higher than 0 volt. The potential of a portion B4 of the first bit line B11 is lower than the potential of the data line DL1 by the total of the threshold voltages of the transistors T11 and T31 of the first column selector. The potential of a portion B3 of the second bit line B12 is lower than the potential of the portion B4 of the first bit line B11 by the threshold voltage of the memory cell M3 (see FIG. 2). As a result, the potential of the data line DL2 is lower than the potential of the data line DL1 by a voltage Vth which is the sum of the threshold voltages of the column selectors T11, T31, T33, and T21 and the threshold voltage of the memory cell M3, i.e., Vhi−Vth.

When the threshold voltage of the memory cell M3 is low (ON state), the voltage Vth, which is the sum of the threshold voltages of the column selectors T11, T31, T33, and T21 and the threshold voltage of the memory cell M3, is a value somewhere between the voltage Vhi and a ground voltage Voff, while the potential of the data line DL2 is a voltage Von which is higher than the ground voltage Voff. When the memory cell M4 is in the ON state, a leakage current may flow from the portion B4 of the first bit line to a portion B5 of the second bit line via the memory cell M4. However, the variation in the current flowing into the portion B3 of the second bit line is small compared with the variation in the current flowing into the first bit line.

The ground voltage Voff is a potential of the data line DL2 obtained after the second bit line B12 is discharged. Since the resistance between the drain and source electrodes of the memory cell is larger than that of the transistors of the column selectors, a current flowing into the leakage circuit TR1 varies little, even though the current flowing in the first bit line varies.

When the threshold voltage of the memory cell M3 is high (OFF state), no bit line current flows. Accordingly, the potential of the data line DL2 retains the ground voltage Voff obtained after the second bit line is discharged by the discharger TD2.

When potential leakage currents flowing at the leakage circuit TR1, the portion B3 of the second bit line, and the data line DL2 are negligibly small, the change in the potential of the data line DL2 is negligibly small. As a result, information in the memory cell can be read substantially stably.

The sense amplifier SA is deactivated during the period from time T2 to time T3 when an equalizing signal EQU is at the high level, i.e., during the discharge period. The level of the data line DL2 changes immediately after the change in the address signal. However, during the period from time T2 to time T3, the sense amplifier SA short-circuits a terminal connected to the data line DL2 and a terminal connected to the reference line. Thus, the sense amplifier SA does not become unstable. The equalizing signal EQU is generated based on the discharge signal DIS. The sense amplifier SA compares the potential of the data line DL2 with the reference voltage Vref of the reference line after time T4, and outputs the output voltage SAout corresponding to the comparison result. The reference voltage Vref may be a value in the middle between the voltage Von and the voltage Voff.

In the NAND type semiconductor memory device of FIG. 4, one end of each column of memory cells is connected to the terminal Vcc via the first column selector having transistors T11 and T12, while the other end is connected to ground GND via a leakage circuit and the second column selector having transistors T13 and T14. In this NAND type semiconductor memory device, information of a selected memory cell M2 can be read by comparing a voltage Vbit generated by a leakage circuit connected between the second column selector T13 and T14 and ground GND with the reference voltage. Accordingly, the NAND type semiconductor memory cell of FIG. 4 has substantially the same effects as those of the semiconductor memory device of FIG. 5.

Figure 8:
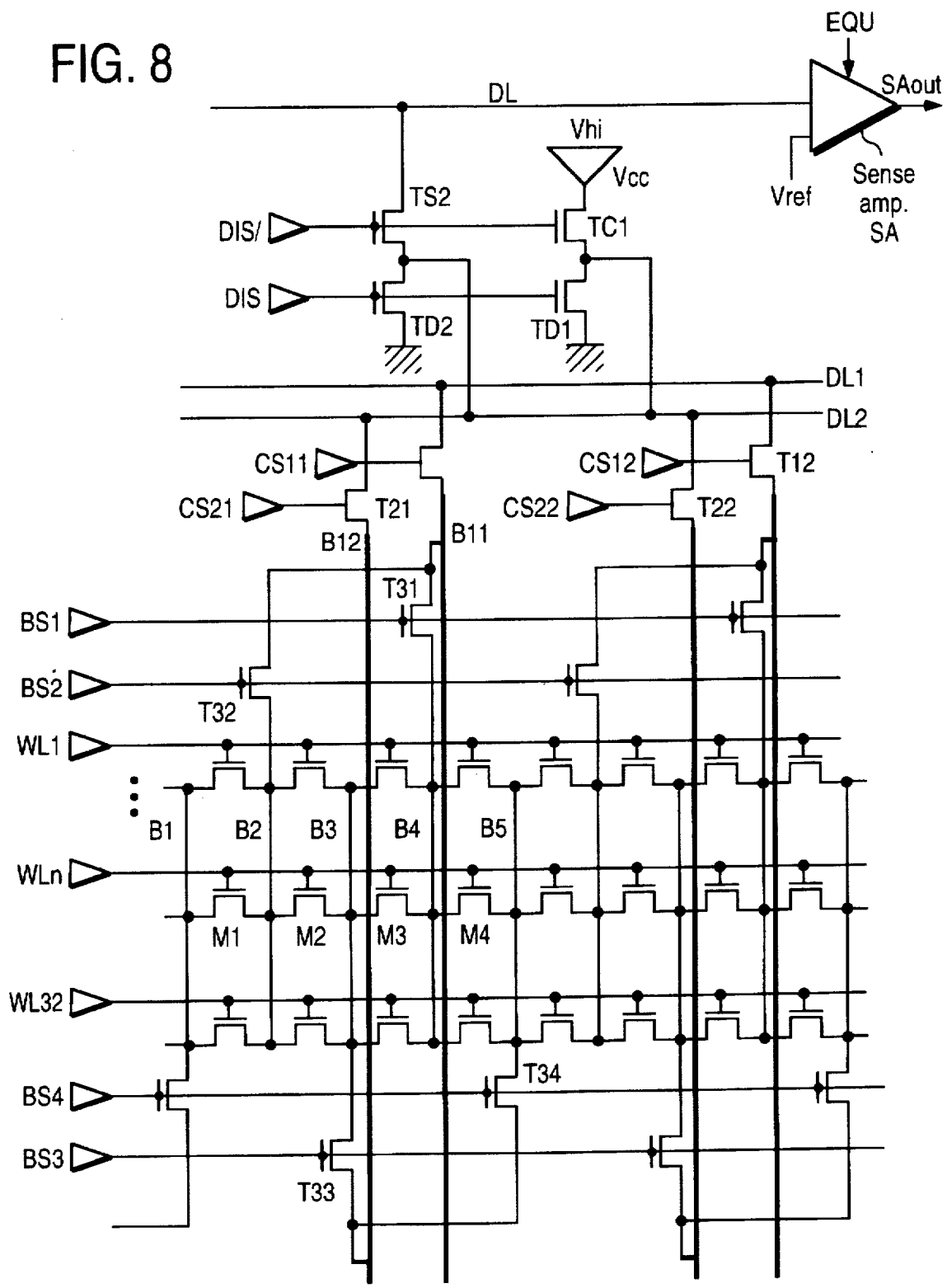
FIG. 8 shows a configuration of a portion of a modified semiconductor memory device according to the present invention.

In the semiconductor memory device of FIG. 5, the sense amplifier SA is directly connected to the data line DL2. However, as shown in FIG. 8, the sense amplifier SA may be connected to the data line DL2 via a transistor TS2. With this configuration, the sense amplifier SA and the data line DL2 can be electrically isolated from each other during the discharge period. This serves to stabilize the operation of the sense amplifier SA during the discharge period.

In the semiconductor memory device of FIG. 8, a charger TC1 may be composed of N-channel MOSFETs, so that the entire memory cell array can be composed of N-channel MOSFETs. This makes it possible to reduce the chip area of the semiconductor memory device of FIG. 8 compared with the semiconductor memory device of FIG. 5.

(EXAMPLE 2)

A second example of the semiconductor memory device according to the present invention will be described with reference to FIG. 9. In this example, the same components are denoted by the same reference numerals as those in Example 1, and the description thereof is omitted.

Figure 9:
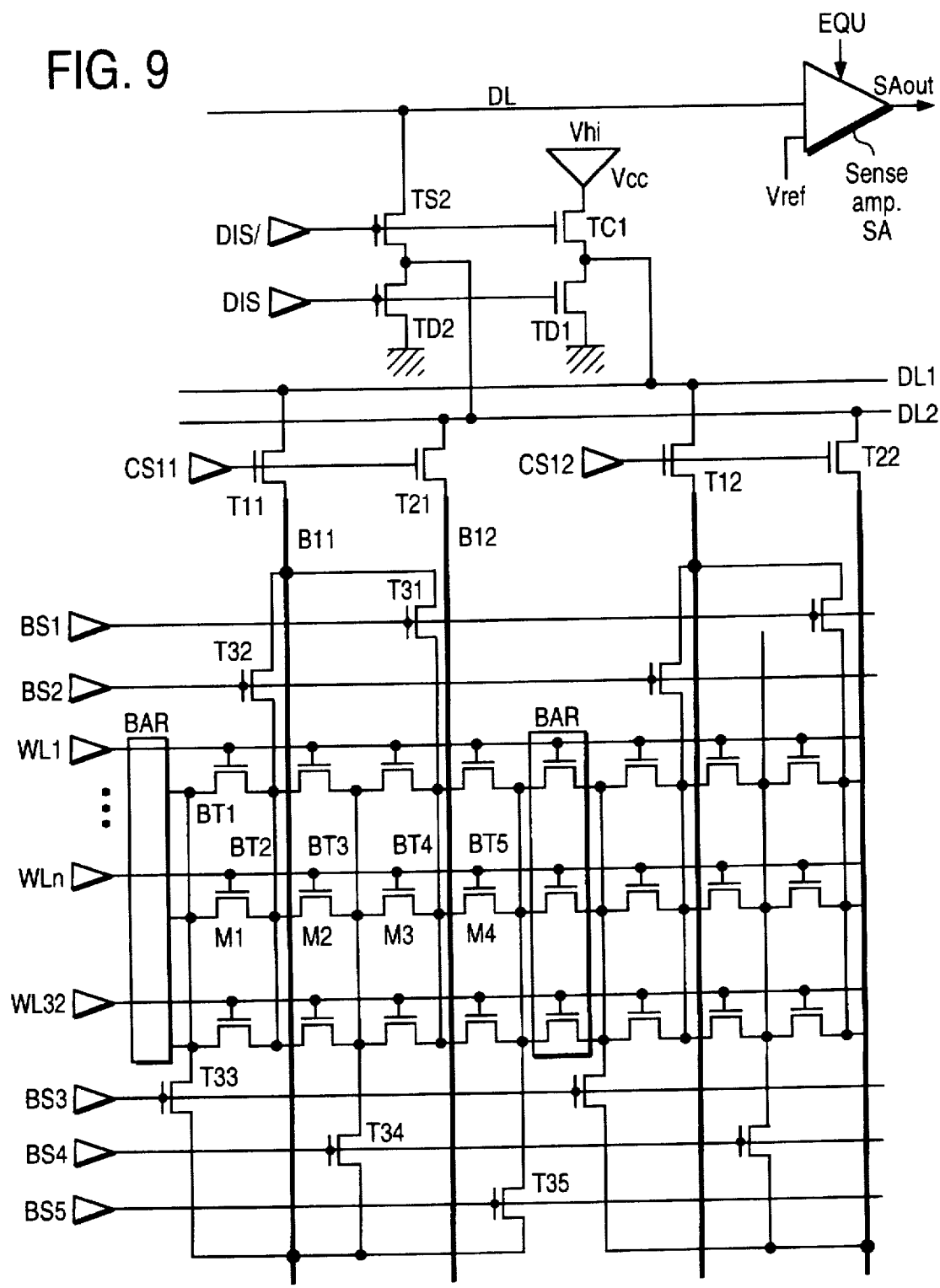
FIG. 9 shows a configuration of a portion of a semiconductor memory device of Example 2 according to the present invention.

The semiconductor memory device of FIG. 9 includes a plurality of memory cells (M1, M2, M3, and M4, for example) arranged in a matrix, a plurality of word lines WL1, ..., WLn, ..., WL32 connected to gate electrodes of the memory cells, a plurality of first main bit lines (B11, for example), a plurality of first sub-1 bit lines (BT2, for example), a plurality of first sub-2 bit lines (BT4, for example), a plurality of second main bit lines (B12, for example), a plurality of second sub-1 bit lines (BT1, for example), a plurality of second sub-2 bit lines (BT3, for example), a plurality of second sub-3 bit lines (BT5, for example), a first column selector (T11, T12, T31, and T32, for example) for selecting one of the plurality of first bit lines, a second column selector (T21, T22, T33, T34, and T35, for example) for selecting one of the plurality of second bit lines, dischargers (TD1 and TD2, for example) for discharging the first and second bit lines selected by the column selectors, chargers (TC1, for example) for charging the first bit line selected by the first column selector (T11, T12, T31, and T32, for example), leakage circuits (TR1, for example), and sense amplifiers (SA, for example).

The plurality of memory cells M1, M2, M3 and M4 are classified into a plurality of memory groups. At least one of the plurality of memory groups includes first, second, third, and fourth columns. At least one of these columns of one memory group includes a plurality of memory cells. Each memory cell includes a drain electrode, a source electrode, and a gate electrode.

The source electrode and drain electrode of the memory cell M1 included in the first column of one memory group are connected to the second sub-1 bit line BT1 and the first sub-1 bit line BT2, respectively. Likewise, the source electrode and drain electrode of the memory cell M2 included in the second column of the one memory group are connected to the second sub-2 bit line BT3 and the first sub-1 bit line BT2, respectively. The source electrode and drain electrode of the memory cell M3 included in the third column of the memory group are connected to the second sub-2 bit line BT3 and the first sub-2 bit line BT4, respectively. The source electrode and drain electrode of the memory cell M4 included in the fourth column of the one memory group are connected to the second sub-3 bit line BT5 and the first sub-2 bit line BT4, respectively.

The first main bit line B11 is connected to the first sub-1 bit line BT2 via the transistor T32 of the column selector and to the first sub-2 bit line BT4 via the transistor T31 of the column selector. Likewise, the second main bit line B12 is connected to the second sub-1 bit line BT1 via the transistor T33 of the column selector, to the second sub-2 bit line BT3 via the transistor T34 of the column selector, and to the second sub-3 bit line BT5 via the transistor T35 of the column selector.

The transistors T11 and T21 of the column selectors are connected to a column selection line CS11, while the transistors T12 and T22 of the column selector are connected to a column selection line CS12. Likewise, the transistors T31, T32, T33, T34, and T35 of the first and second column selectors are connected to column selection lines BS1, BS2, BS3, BS4, and BS5, respectively. The transistors T11, T12, T21, T22, T31, T32, T33, T34, and T35 of the column selectors are put in the ON state when they receive a high-level signal and in the OFF state when they receive a low-level signal.

The dischargers TD1 and TD2 receive a discharge signal DIS which is either at a high level or a low level. When the discharge signal DIS is at the high level, the potentials of the first and second bit lines selected by the column selector are set at the same potential as that of ground GND. This makes it possible to read information in the selected memory cell correctly. The discharge signal DIS is generated based on the address signal in the configuration shown in FIG. 6.

The charger TC1 supplies a charge to the first bit line selected by the column selector when the discharge signal DIS is at the low level.

The sense amplifier SA is connected to the data line DL2 via the transistor TS2. With this configuration, the sense amplifier SA and the data line DL2 can be electrically isolated from each other during the discharge period. This serves to stabilize the operation of the sense amplifier SA during the discharge period.

In the semiconductor memory device of FIG. 9, the charger TC1 may be composed of N-channel MOSFETs, so that the entire memory cell array can be composed of N-channel MOSFETs. This makes it possible to reduce the chip area of the semiconductor memory device of FIG. 9 compared with the semiconductor memory device of FIG. 5.

In the semiconductor memory device of FIG. 9, one memory group is separated from adjacent memory groups by a separating region BAR which is a column of memory cells in the OFF state. Such a separating region electrically isolates the first sub-1 and sub-2 bit lines BT2 and BT4 and the second sub-1, sub-2, and sub-3 bit lines BT1, BT3, and BT5 belonging to one memory group from those belonging to another memory group. This prevents a leakage current from flowing between memory groups and thus serves to reduce current consumption.

When information in the memory cell M3 is to be read, a predetermined address signal is input into a selector (not shown). Based on a part of the predetermined address signal, the selector selects the column selection lines CS11, BS1, and BS4 to put them at a high level, while holding the other column selection lines at the low level. This allows the column selectors T11, T21, T31, and T34 to be turned to the ON state, selecting the first main bit line B11, the second main bit line B12, the second sub-2 bit line BT3, and the first sub-2 bit line BT4. Based on another part of the predetermined address signal, the selector selects the word line WLn to put it at the high level, while holding the other word lines at the low level. Thus, the memory cell M3 is selected.

The read operation of the semiconductor memory device of FIG. 9 is substantially the same as that of the semiconductor memory device of FIG. 5. Thus, the semiconductor memory device of FIG. 9 has substantially the same effects as those of the semiconductor memory device of FIG. 5.

(EXAMPLE 3)

A third example of the semiconductor memory device according to the present invention will be described with reference to FIG. 10. In this example, the same components are denoted by the same reference numerals as those in Example 1, and the description thereof is omitted.

Figure 10:
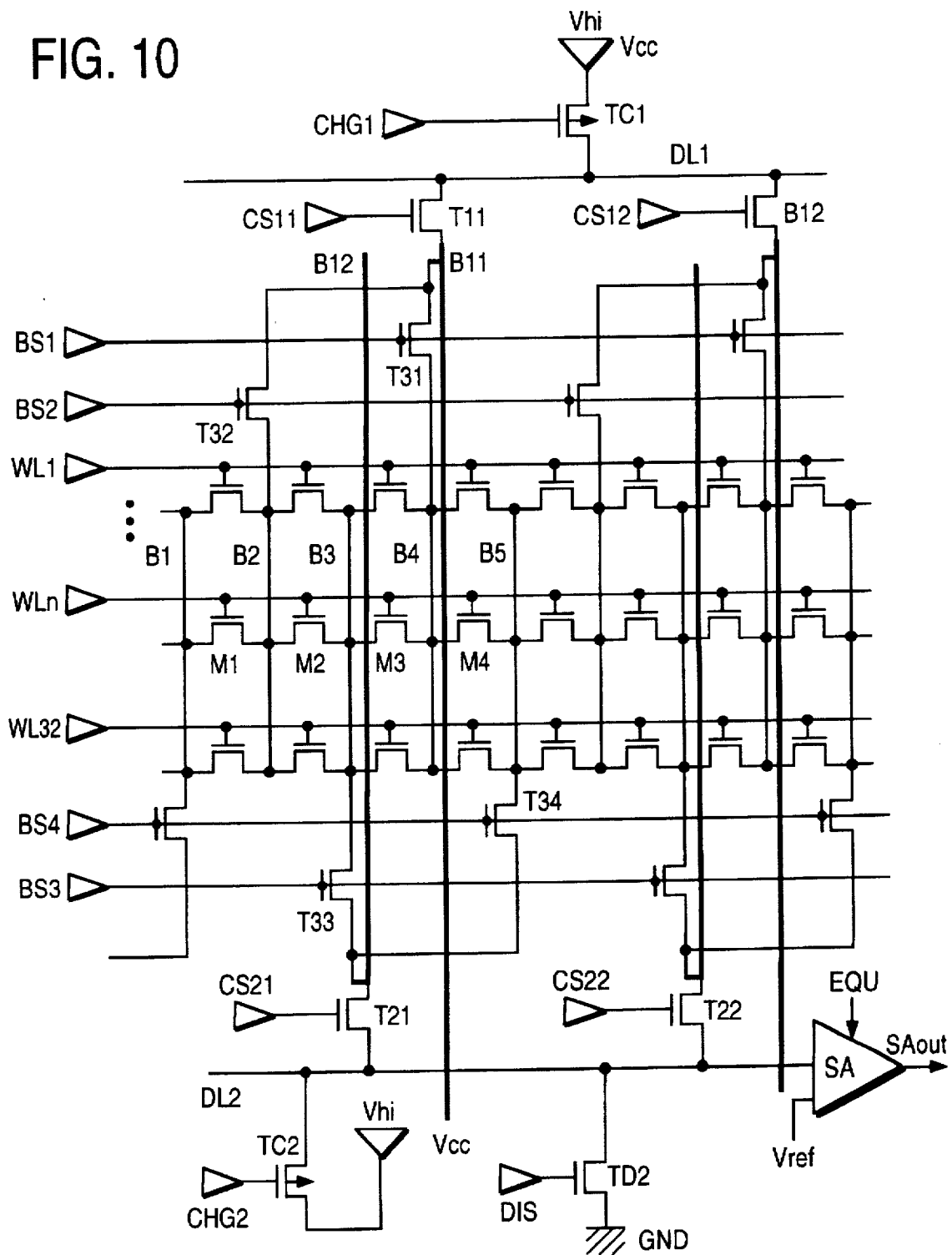
FIG. 10 shows a configuration of a portion of a semiconductor memory device of Example 3 according to the present invention.

The configuration of the semiconductor memory device of FIG. 10 is the same as that of the semiconductor memory device of FIG. 5, except for the following points. The semiconductor memory device of FIG. 10 does not include the discharger connected to the data line DL1 and the leakage circuit connected to the data line DL2 which are included in the semiconductor memory device of FIG. 5. Also, the semiconductor memory device of FIG. 10 includes a charger TC2 connected to the data line DL2 which is not included in the semiconductor memory device of FIG. 5.

The charger TC1 controls the connection between a terminal Vcc and a data line DL1 based on a charge signal CHG1 which is either a high level or a low level. The charger TC1 connects the terminal Vcc and the data line DL1 when the charge signal CHG1 is at the high level, while it does not connect when the charge signal CHG1 is at the low level.

A charger TC2 controls the connection between a terminal Vcc and the data line DL2 based on a charge signal CHG2 which is either a high level or a low level. The charger TC2 connects the terminal Vcc and the data line DL2 when the charge signal CHG2 is at the high level, while it does not connect when the charge signal CHG2 is at the low level.

Figure 11:
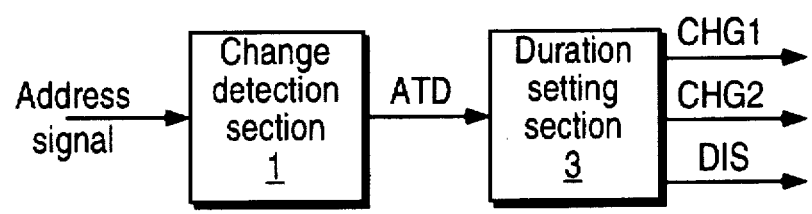
FIG. 11 shows a configuration of a circuit for generating a discharge signal and a charge signal.

Referring to FIG. 11, the charge signals CHG1 and CHG2 are generated by a change detection section 1 and a duration setting section 3. The change detection section 1 receives an address signal, detects a change in the address signal, and outputs a signal ATD to the duration setting section 3 in response to the change in the address signal. The signal ATD is either at a high level or a low level. The duration setting section 3 receives the signal ATD from the change detection section 1, and outputs the low-level charge signal CHG1 to the charger TC1 while outputting the low-level charge signal CHG1 to the charger TC2 for a duration predetermined based on the signal ATD. When the predetermined duration has passed after the output of the low-level charge signal CHG2, the duration setting section 3 outputs a high-level discharge signal DIS to a discharger TD2. The initial levels of the charge signals CHG1 and CHG2 are high, while the initial level of the discharge signal DIS is low.

In the semiconductor memory device of FIG. 10, the data lines DL1 and DL2 are charged by the chargers TC1 and TC2 for the period when the charge signals CHG1 and CHG2 are at the low level until the potentials of the data lines DL1 and DL2 reach a voltage Vhi of the terminal Vcc. When the discharge signal DIS switches to the high level, the charger TC2 terminates charging the data line DL2 and then the discharger TD2 discharges the data line DL2 to the ground.

Figure 12:
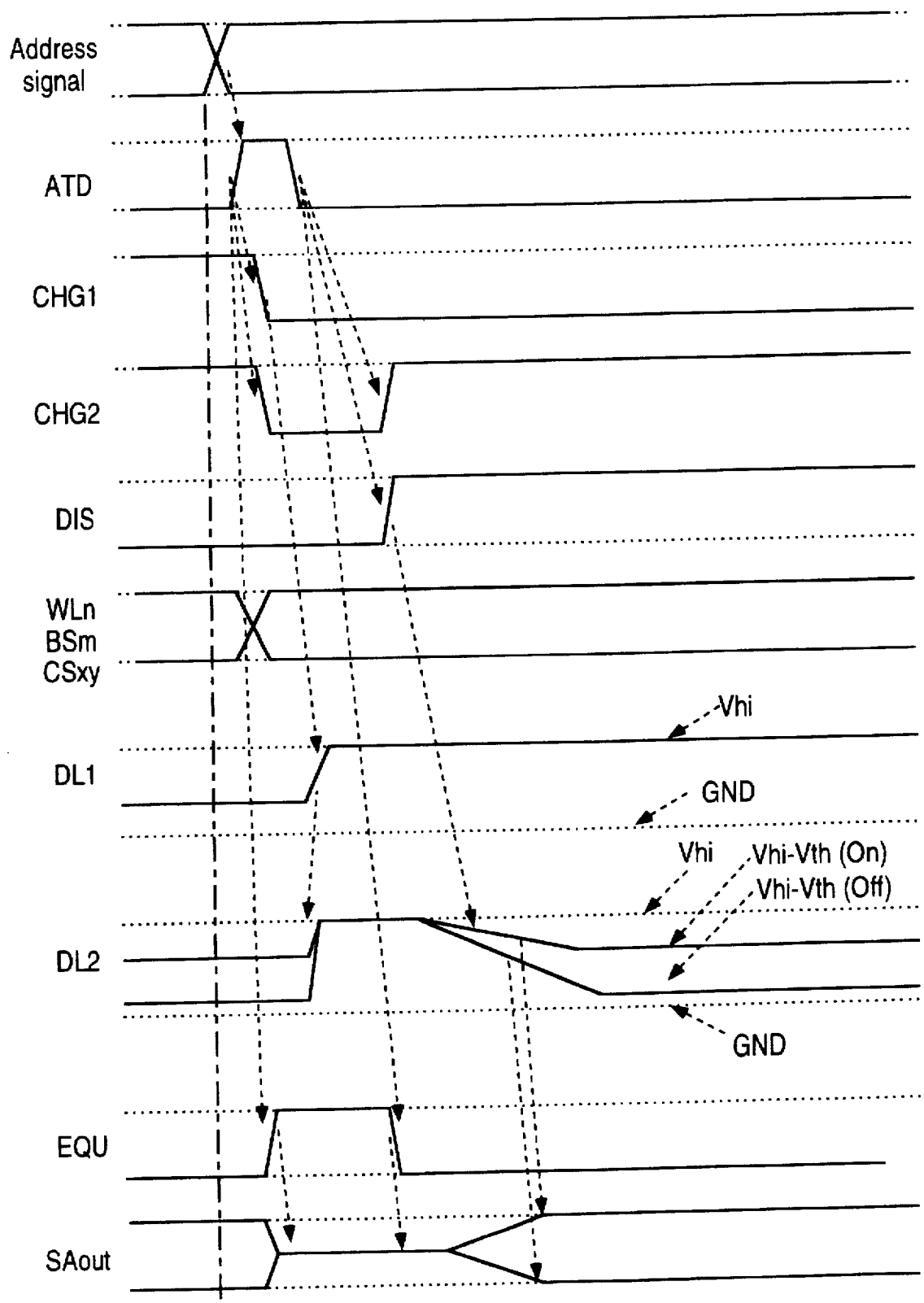
FIG. 12 is a timing chart of the semiconductor memory device of FIG. 10.

Hereinbelow, the read operation of the semiconductor memory device of FIG. 10 will be described with reference to the timing chart of FIG. 12. In the following description, it is assumed that information written in the memory cell M3 is to be read.

A selector (not shown) selects the column selection lines BS1, BS3, CS11, and CS21 to put them at the high level based on the address signal, so that a first bit line B11 and a second bit line B12 are selected.

The chargers TC1 and TC2 charge the selected first and second bit lines B11 and B12 during the period when the charge signals CHG1 and CHG2 are at the low level. When the charge signal CHG2 is switched to the high level, the charger TC2 is put in the OFF state while the discharger TD2 is put in the ON state. This allows the data line DL2 to be discharged to reduce the potential thereof from the value equal to the voltage Vhi of the terminal Vcc by a threshold voltage Vth which is the sum of the threshold voltages of the column selector T11, T31, T33, and T21 and the memory cell M3.

Figure 13:
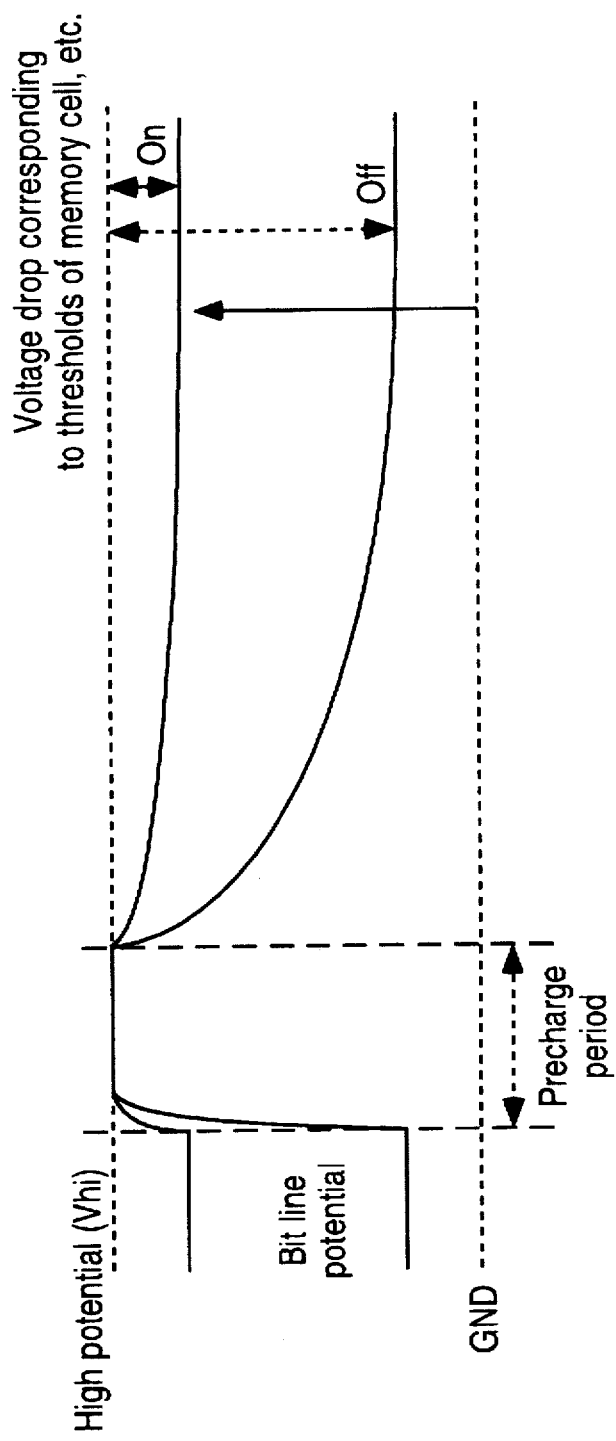
FIG. 13 shows a potential of a bit line of the semiconductor memory device of FIG. 10.
Figure 14:
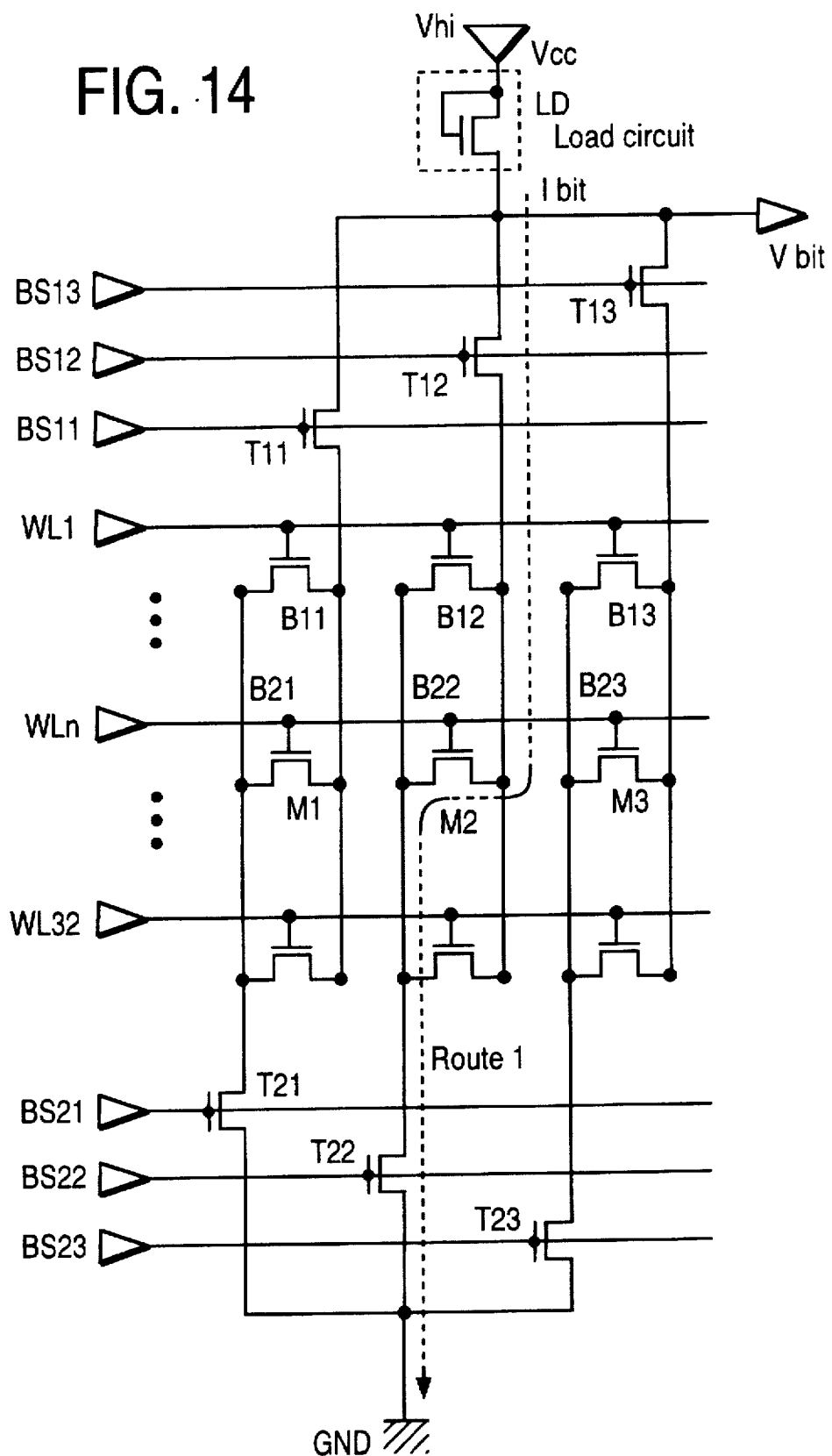
FIG. 14 shows a configuration of a portion of a conventional semiconductor memory device.
Figure 15:
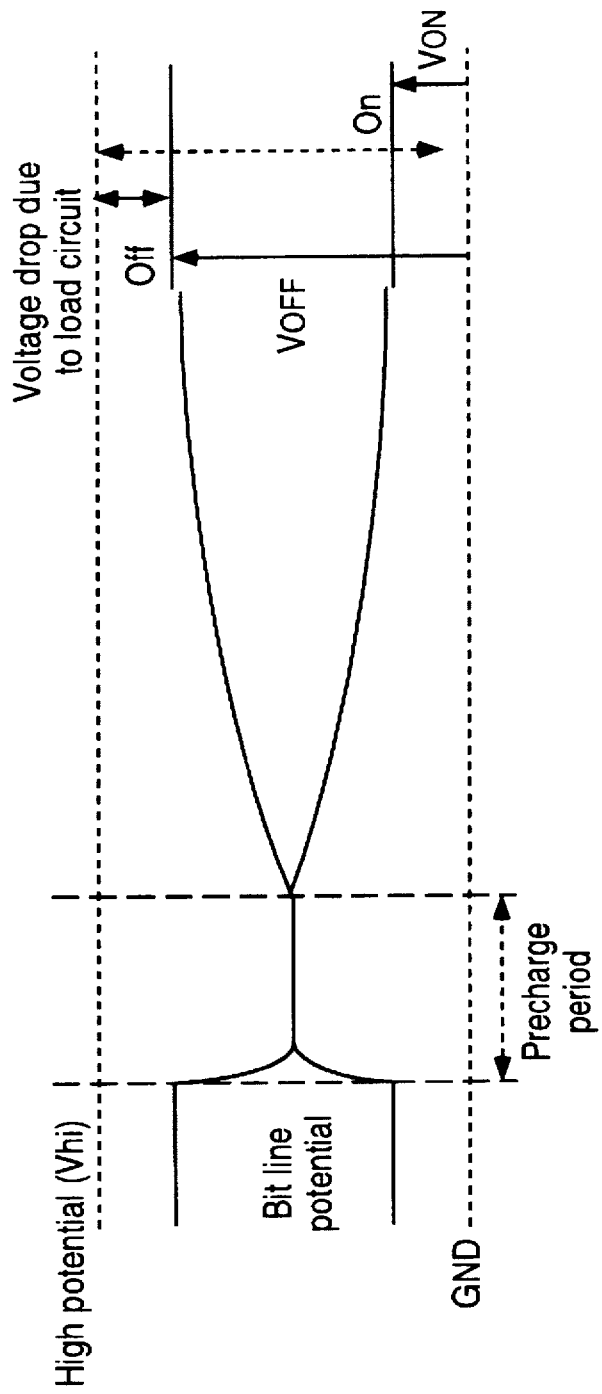
FIG. 15 shows a potential of a bit line of the semiconductor memory device of FIG. 14.
Figure 16:
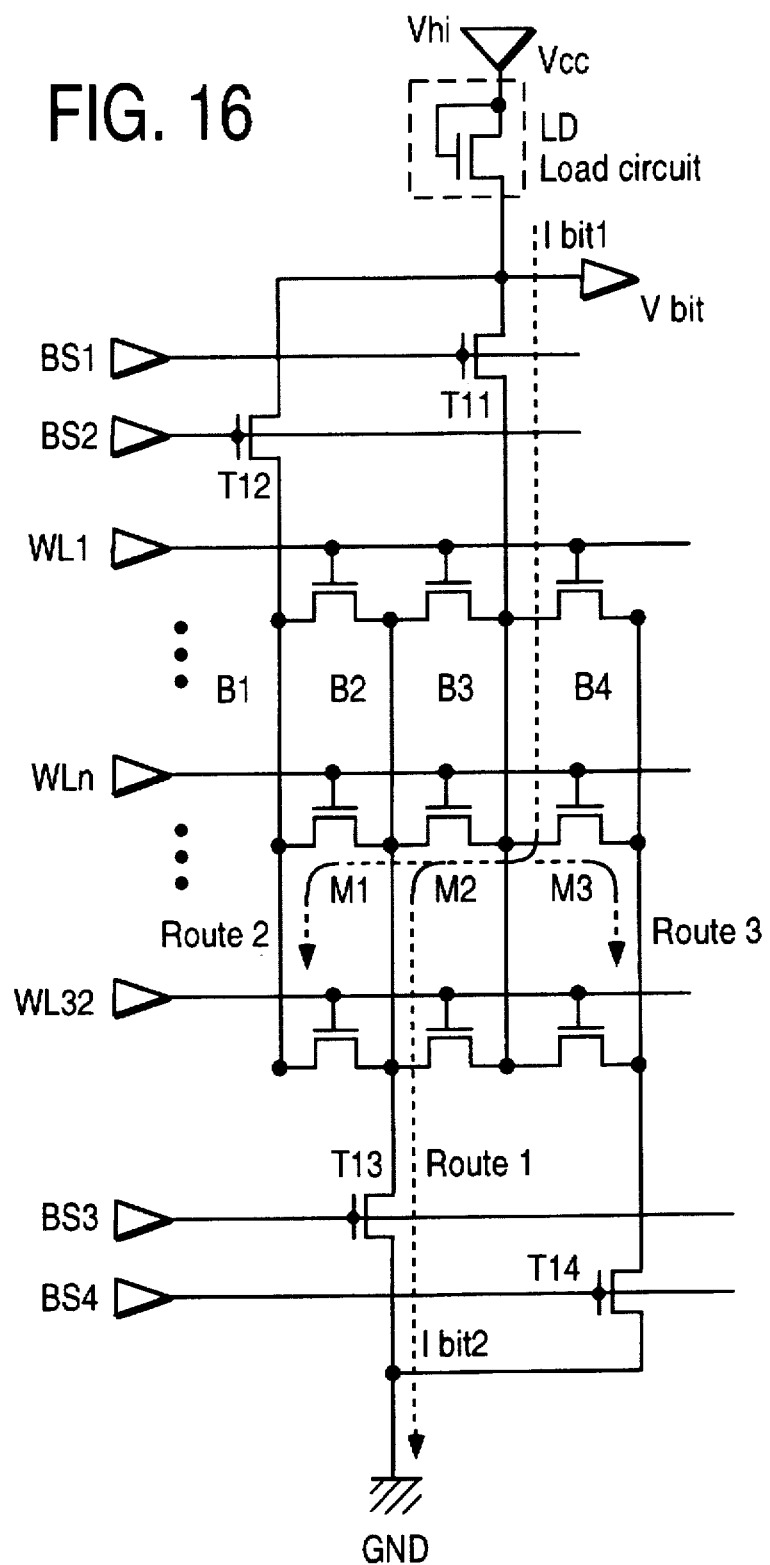
FIG. 16 shows a configuration of a portion of another conventional semiconductor memory device.

The relationship between the threshold voltage Vth and the voltage Vhi of the terminal Vcc changes depending on the state of the memory cell selected based on the address signal. Specifically, referring to FIG. 13, when the threshold of the memory cell M3 is low (ON state), the threshold voltage Vth is lower than the voltage Vhi of the terminal Vcc, so that the potential of the data line DL2 is equal to a voltage Von which is higher than the ground voltage Voff. On the contrary, when the threshold of the memory cell M3 is high (OFF state), no current flows between the first main bit line B11 and the second bit line B12, and the discharger TD2 discharges the data line DL2 until the potential of the data line DL2 reaches the ground voltage Voff.

The sense amplifier SA receives the voltage of the data line DL2 and the reference voltage Vref, and outputs an output voltage SAout.

Thus, the semiconductor memory device of FIG. 10, like the semiconductor memory device of FIG. 5, measures the potential of the second bit line which is less influenced by a leakage current. This makes it possible to ensure a substantially stable read operation.

Thus, according to the present invention, in nonvolatile semiconductor memory devices such as mask ROMs and EEPROMs, information stored in a memory cell is read by measuring the potential of a corresponding bit line which is less influenced by a leakage current even if the leakage current flows in a bit line adjacent to the selected bit line. This makes it possible to substantially stably read information in selected memory cells. Moreover, according to the present invention, the amount of current flowing in a bit line can be reduced when information in a memory cell is being read, compared with the conventional semiconductor memory device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a plurality of memory cells arranged in a matrix;
   a plurality of word lines;
   a plurality of first bit lines;
   a plurality of second bit lines;
   a first column selection circuit for selecting a first bit line from the plurality of first bit lines;
   a second column selection circuit for selecting a second bit line from the
   plurality of second bit lines; and
   an amplifier,
   wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to one of the column groups is connected to the gate electrode of the memory cell belonging to another one of the column groups via one of the plurality of word lines, and
   the amplifier amplifies a potential of the selected second bit line.

2. A semiconductor memory device according to claim 1, further comprising a first charger for charging the selected first bit line so that the selected first bit line obtains a first potential.

3. A semiconductor memory device according to claim 1, further comprising a second charger for charging the selected second bit line so that the selected second bit line obtains a second potential.

4. A semiconductor memory device comprising:
   a plurality of memory cells arranged in a matrix;
   a plurality of word lines;
   a plurality of first bit lines;
   a plurality of second bit lines;
   a first column selection circuit for selecting a first bit line from the plurality of first bit lines;
   a second column selection circuit for selecting a second bit line from the plurality of second bit lines;
   a first discharger for discharging the selected first bit line and a second discharger for discharging the selected second bit line; and
   an amplifier, wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to another one of the column groups is connected to the gate electrode of the memory cell belonging to another one of the column groups via one of the plurality of word lines, and
   the amplifier amplifies a potential of the selected second bit line.

5. A semiconductor memory device comprising:
   a plurality of memory cells arranged in a matrix;
   a plurality of word lines;
   a plurality of first bit lines;
   a plurality of second bit lines;
   a first column selection circuit for selecting a first bit line from the plurality of first bit lines;
   second column selection circuit for selecting a second bit line from the plurality of second bit lines;
   a first discharger for discharging the selected first bit line; and
   an amplifier,
   wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to one of the column groups is connected to the gate electrode of the memory cell belonging to another one of the column groups via one of the plurality of word lines, and
   the amplifier amplifies a potential of the selected second bit line.

6. A semiconductor memory device comprising:
   a plurality of memory cells arranged in a matrix;
   a plurality of word lines;
   a plurality of first bit lines;
   a plurality of second bit lines;
   first column selection circuit for selecting a first bit line from the plurality of first bit lines;
   second column selection circuit for selecting a second bit line from the plurality of second bit lines;
   a leakage circuit for allowing a current flowing through the selected second bit line to leak; and
   an amplifier,
   wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to one of the column groups is connected to the gate electrode of the memory cell belonging to another one of the column groups via one of the plurality of word lines, and
   the amplifier amplifies a potential of the selected second bit line.

7. A semiconductor memory device according to claim 4, further comprising a first charger for charging the selected first bit line so that the selected first bit line obtains a first potential, wherein the first and second dischargers discharge the selected first and second bit lines for a certain duration, and the first charger charges the selected first bit line after the certain duration has passed from a predetermined time so that the selected first bit line reaches the first potential.

8. A semiconductor memory device according to claim 1, wherein the respective second bit lines are provided on a ground level side of the memory cells.

9. A semiconductor memory device according to claim 1, wherein each of the second bit lines is coupled to a ground level.

10. A semiconductor memory device according to claim 6, further comprising a discharger for discharging the selected second bit line.

11. A semiconductor memory device comprising:

a plurality of memory cells arranged in a matrix;

a plurality of word lines;

a plurality of first bit lines;

a plurality of second bit lines;

a first column selection circuit for selecting a first bit line from the plurality of first bit lines;

a second column selection circuit for selecting a second bit line from the plurality of second bit lines;

a first charger for charging the selected first bit line and a second charger for charging the selected second bit line so that the selected first and second bit lines obtain a first potential and a second potential, respectively;

a discharger for discharging the selected second bit line; and an amplifier, wherein each of the plurality of memory cells includes a drain electrode, a source electrode, and a gate electrode, and the plurality of memory cells are classified into a plurality of column groups, where the drain electrodes of the memory cells belonging to the same column group are connected to the same first bit line, the source electrodes of the memory cells belonging to the same column group are connected to the same second bit line, and the gate electrode of the memory cell belonging to one of the column groups is connected to the gate electrode of the memory cell belonging to another one of the column groups via one of the plurality of word lines, and the amplifier amplifies a potential of the selected second bit line.

* * * * *